United States Patent [19]

Weinhold et al.

[11] Patent Number: 4,917,926

[45] Date of Patent: Apr. 17, 1990

[54] SOLUBLE TAPE AND FILM

[75] Inventors: Lutz R. Weinhold, Fenor-Tramore; John D. McDonough, Waterford, both of Ireland

[73] Assignee: Waterford Research & Development Limited, Waterford, Ireland

[21] Appl. No.: 196,510

[22] Filed: May 20, 1988

Related U.S. Application Data

[63] Continuation-in-part of Ser. No. 59,950, Jun. 9, 1987, abandoned.

[30] Foreign Application Priority Data

May 21, 1987 [IE] Ireland .................................. 1336/87
Nov. 9, 1987 [IE] Ireland .................................. 3002/87

[51] Int. Cl.$^4$ .............................................. B32B 9/00
[52] U.S. Cl. ...................................... 428/40; 156/155; 427/154; 428/80; 428/343; 428/352; 428/356; 428/511; 428/515; 428/901; 428/906
[58] Field of Search ..................... 156/155; 427/154; 428/343, 901, 40, 80, 352, 356, 511, 515, 906

[56] References Cited

U.S. PATENT DOCUMENTS 4,601,934  6/1986  Beverly ................................. 428/40

FOREIGN PATENT DOCUMENTS 1059695  7/1979  Canada ................................. 402/372
1155612  6/1969  United Kingdom .

OTHER PUBLICATIONS

Derwent Accession No. 73-03 706 U Abstract of Japanese Patent Publication 73-001,105 (Nitto Electrical Industries Co., Ltd.).
Handbook of Pressure-Sensitive Adhesive Technology-Edited by Donatas Satas, 2nd Edition 1989, Van Nostrand Reinhold, p. 656.
Du Pont FREON Bulletin FST-5H, Du Pont de Nemours International S.A., Geneva, Switzerland, Table III, p. 2.
"Intertronics in Masking Advance", Electronics Weekly, Oct. 7, 1987.
"Dissolving Tape Speeds . . . ", The Engineer, 15 Oct. 1987, p. 43.
"Lifting the Mask . . . ", Electronics Express, 6 Oct. 1987.
"PCB Masking Tape", Elec. Product News, Dec. 1987.
PPI 2000, PPI Ad. Products Corp., Paoli, Pa.
"Elv-Away Products Tape", Product Data, Arco, Idaho, 2 sheets.
"Elvacite", Properties and Uses Dupont, p. 9.
"Positive PCB Protection", Chemtronics.
Chemask S-Technical Bulletin.
Arklone, for fast, effective flux removal, pp. 1-2.
Material Data Sheet-U.S. Dept. of Labor, OSHA, Chemtronics, Inc.

Primary Examiner—Marion C. McCamish
Attorney, Agent, or Firm—Nixon & Vanderhye

[57] ABSTRACT

A pressure-sensitive adhesive tape for masking selected areas of an article such as a printed circuit board during high temperature operations such as wave soldering comprises a polymeric film coated with a layer of pressure-sensitive adhesive, both film and adhesive being resistant to temperatures up to 250° C. for up to 5 seconds and being soluble in a fluorocarbon solvent such as a trichlorotrifluoroethane solvent. More particularly the film and adhesive are resistant to temperatures up to 260° C. for up to 25 seconds.

The polymeric film, which is a novel self-supporting film, may suitably comprise a polymethacrylate other than poly(methyl methacrylate) e.g. poly(butyl methacrylate), or ethyl cellulose or polyvinylpyrrolidone.

Masking material for electronic components comprises a polymethacrylate other than poly(methyl methacrylate), ethyl cellulose or polyvinyl pyrrolidone, said masking material being in the form of
(a) a continuous roll of tape
(b) shaped pieces, or
(c) a solution or dispersion.

A method is also described which includes applying the masking material to an electronic component, carrying out a high-temperature operation, and then washing the component in a fluorocarbon solvent which dissolves the masking material.

The masking material may also be used at the stage of hot air levelling in printed circuit board production. The material is soluble in methylene chloride.

20 Claims, No Drawings

SOLUBLE TAPE AND FILM

CROSS-REFERENCE TO RELATED APPLICATIONS

This application is a continuation-in-part of application Ser. No. 059,950 filed June 9, 1987, now abandoned.

BACKGROUND OF THE INVENTION

1. Field of the Invention

This invention relates to pressure-sensitive adhesive tapes, to films used in such tapes and to the use of the tapes for masking selected areas of an article during high temperature treatments, particularly for masking selected areas of electronic components such as printed circuit boards during soldering operations.

2. Description of the Related Art

Certain areas of printed circuit boards such as contact fingers and drill holes must be masked during soldering operations (for example wave soldering or hot air levelling) in such a way that no solder will penetrate into the masked area. This involves covering the selected areas with a material that will withstand the temperature of the soldering operations. In the case of wave soldering the temperature is of the order of 240°–260° C. for an exposure period of from 1 to 25 seconds and in the case of hot air levelling the temperatures can reach 270° C. in the air stream and 250° C. in the tin-lead dip. During this exposure to high temperature, the masking material must not lift from the board or shrink in any way and it must form a complete barrier against solder penetration within the masked area. The masking material must then be easily removable after soldering has taken place.

Most of the masking during wave soldering is presently achieved by use of self-adhesive tapes based on high-temperature-resistant polyimide film with a silicone-based adhesive. These tapes are removed physically from the printed circuit board after wave soldering. This is a time-consuming labour-intensive process.

It is known to wash printed circuit boards after wave soldering in order to remove flux residues. In certain cases, water has been used for this purpose. A water-soluble tape based on polyvinylalcohol is commercially available for masking selected areas of printed circuit boards. This tape is dissolved from the printed circuit board during the washing step. However, water-washing is not generally accepted as being sufficient to render a printed circuit board electronically "clean" and furthermore some residue of adhesive may remain. The use of fluorocarbon solvents, particularly those based on trichlorotrifluoroethane, is preferred for washing purposes. Such washing may suitably be carried out in an ultrasonically agitated bath of the solvent, followed by rinsing in a vapour of the solvent, or by use of a spray system in which the solvent is sprayed by jets onto the printed circuit board. After hot air levelling, it is conventional to wash the printed circuit board in methylene chloride which is a relatively power solvent. However masking materials presently in use during hot air levelling have not been very successful mainly because they are displaced by the hot air jets and they have inadequate heat resistance.

Although a solvent-soluble masking agent is commercially available in solution form, this is less satisfactory to use than a tape which can be handled and applied in predetermined shapes. Also the solution must be left for a certain period to dry and cure, which causes delay.

SUMMARY OF THE INVENTION

The Applicants have now invented a masking material which can efficiently perform the masking of the selected areas of printed circuit boards during the soldering operation but which is completely dissolved by a fluorocarbon solvent. Such a masking material has potential uses in fields other than manufacture of printed circuit boards when masking is required during a high-temperature operation.

The present invention provides a pressure-sensitive adhesive tape comprising a polymeric film coated with a layer of pressure-sensitive adhesive, both film and adhesive being resistant to temperatures up to 250° C. for up to 5 seconds and being soluble in a fluorocarbon solvent. The term "fluorocarbon solvent" as used in this Specification means a solvent which contains at least 50% by weight of a fluorocarbon. The term "tape" as used in this Specification covers not only a continuous tape (i.e. in strip form) but also shaped pieces of tape. Preferably the film and adhesive are resistant to temperatures up to 260° C. for up to 25 seconds.

The tape according to the invention is advantageous because it does not require physical removal after solvent cleaning, which saves labour costs. There is also reduced risk of adhesive transfer to the substrate which could contaminate the contacts.

According to another aspect, the present invention provides a pressure-sensitive adhesive tape comprising a film of a polymethacrylate other than poly(methyl methacrylate), or ethyl cellulose or polyvinyl pyrrolidone, coated with a layer of pressure-sensitive adhesive. The pressure-sensitive adhesive is preferably based on a polyacrylate.

According to a preferred feature, the polymeric material of the film is plasticised by addition of a soft thermoplastic acrylic polymer. This imparts flexibility which enables the tape to conform closely to the contours of the board.

According to another aspect, the present invention provides a self-supporting film of a polymethacrylate other than poly(methyl methacrylate), or ethyl cellulose or polyvinyl pyrrolidone. The term "self-supporting film" as used in this Specification means a film which can be removed from a backing and rolled up as a roll of film without losing its integrity. Although poly(butylmethacrylate) resins are sold for forming thin films (coatings) on various substrates, it was not known hitherto to use polymethacrylates other than poly(methyl methacrylate) to form a self-supporting film.

According to another aspect, the present invention provides masking material for electronic components comprising a film-forming polymethacrylate other than poly(methyl methacrylate), or ethyl cellulose or polyvinyl pyrrolidone, said masking material being in the form of a continuous roll of tape or of shaped pieces or of a solution or dispersion. In the case of shaped pieces, the pieces of polymeric material may suitably be carried on a tape or sheet, for example, of release material.

In yet another aspect, the present invention provides a method of masking a selected area of an electronic component such as a printed circuit board during a high-temperature operation, such as soldering, which method comprises applying the masking material as defined above to the selected area, carrying out the high-temperature operation, and then washing the component in a fluorocarbon solvent which dissolves the masking material. The masking material may suitably be applied in the form of a pressure-sensitive adhesive tape or shaped pieces, or it may be cast directly onto the selected areas of the electronic component, e.g. by screen printing.

Preferably the polymeric film is cast from a solution or dispersion of the polymer. However, an extruded film of the polymer may also be used. It is preferred to cast the polymeric material onto a support, such as a tape or sheet of release material.

The preferred materials for the polymeric film are polymethacrylates other than poly(methyl methacrylate). Particular preferred monomers are alkyl esters of methacrylic acid wherein the alkyl group contains at least 3 carbon atoms, more particulaly 3-6 carbonatoms. Preferred alkyl groups are n-propyl, i-propyl, n-butyl, i-butyl, sec-butyl and tert-butyl. The polymethacrylates may suitably be homopolymers of the said preferred monomers; or mixtures of two or more such homopolymers; or mixtures of one or more such homopolymers with one or more homopolymers of an alkyl ester of methacrylic acid having less than 3 or more than 6 carbon atoms in the alkyl group, in particular poly(methyl methacrylate) or poly(ethyl methacrylate) in an amount up to 45%, more preferably up to 30%, by weight of the homopolymers of the said preferred monomers; or copolymers of two or more of the said preferred monomers; or mixtures of two or more such copolymers; or copolymers of one or more of the said preferred monomers with one or more co-monomers which may be an alkyl ester of methacrylic acid having less than 3 or more than 6 carbon atoms in the alkyl group, in particular methyl methacrylate or ethyl methacrylate. The said co-monomer (if present) is in an amount up to 45%, more preferably up to 30%, by weight of said preferred monomer. Another compatible co-monomer may also be present. The most preferred polymethacrylates are polymers of butyl esters of methacrylic acid or copolymers thereof with each other or with methyl methacrylate or with a compatible co-monomer, which may suitably be present in an amount of 0-45%, more preferably 0-30%, by weight of the preferred monomers, or a mixture of the preferred polymethacrylates with each other or with poly(methyl methacrylate) or with a compatible additive, particularly a non-migrating, plasticising additive, which may also be suitably present in an amount of 0-45%, more preferably 0-30%, by weight of the preferred polymethacrylate. Alternatively, or in addition, the polymethacrylate may be plasticised by addition of a soft thermoplastic acrylic polymer such as poly(butyl acrylate) in an amount up to 90%, preferably from 5% to 50%, by weight of the poly(methacrylate). In the case of an acrylic plasticiser the preferred range is from 7.14% up to 40%, more particularly 12-30%, by weight of polymethacrylate whereas for a non-acrylic plasticiser the preferred range is up to 40% by weight of the polymethacrylate. Suitable polymethacrylates normally have a molecular weight in the range of 50,000-500,000. Suitable polymethacrylates are commercially available in solid, solution or dispersion form from suppliers such as Roehm GmbH, Darmstadt, Federal Republic of Germany or E. I. du Pont de Nemours & Co Inc. or Rohm & Haas Company. Although the polymeric material may soften under the chosen high-temperature conditions, it must not flow to any appreciable extent.

Other polymeric film materials which have the required combination of properties include ethyl cellulose and polyvinyl pyrrolidone having a molecular weight in the range of 50,000-500,000. Polyvinyl pyrrolidone is commercially available from B.A.S.F., Ludwigshafen, under the Trade Mark "Luviskol", or from GAF Corporation. Ethyl cellulose is commercially available from Hercules Corporation or from Dow Chemical Company.

The self-adhesive layer may suitably comprise a thermoplastic acrylic adhesive, particularly a polyacrylate such as a homopolymer of butyl acrylate or a copolymer thereof, preferably with a molecular weight in the range of 400,000-3,000,000, tackified with a suitable resin such as an alkyl phenolic type which may be present in an amount of 0-90% by weight of the polyacrylate. Other adhesive compositions which withstand temperatures of 240°-260° C. (i.e. which fully retain their adhesive ability and remain thermoplastic at such temperatures), and which are soluble in a chosen fluorocarbon solvent, may also be used. For example, a rubber resin in solution or latex form or a silicone-type adhesive may be suitable.

A release material is usually juxtaposed against the self-adhesive layer. The release material may suitably be a tape or sheet, for example if silicone material such as siliconised polyethylene terephthalate (P.E.T.P.) film or siliconised paper, or it may be a non-silicone material. Alternatively, the release material may be in the form of a solution or dispersion which is applied to the cast polymeric film on the face opposing the self-adhesive layer when the tape is to be wound up in a self-wound roll.

The masking material may, if desired, be coloured in order to render it visible on an electronic component. For example, a pigment or dye may be included in the polymeric film material or in the adhesive. The masking material may be transparent or opaque.

In the preferred embodiment of the invention, the polymeric film is cast from a polymer solution onto a release film or paper such as siliconised P.E.T.P. or siliconised paper. The most preferred polymeric material is poly(butyl methacrylate) plasticised with 0-50% (more preferably 12-30%) by weight (based on the methacrylate) of poly(butyl acrylate). The poly(butyl methacrylate) is a medium-hard polymer which gives a brittle colourless film which is soluble in chlorinated hydrocarbons. The poly(butyl acrylate) is a soft polymer which imparts flexibility and toughness to the film, and which is also soluble in chlorinated hydrocarbons. The preferred solvent for the polymer solution is trichloroethylene. However, other organic solvents, particularly other chlorinated hydrocarbons such as methylene chloride, may be used.

The cast film is suitably dried at 80°-160° C. for 2-10 minutes. Film thicknesses of 0.005 mm-0.250 mm are suitable, more particularly 0.01-0.075 mm, preferably 0.035-0.050 mm, when the film is intended for masking printed circuit boards.

The self-adhesive layer may suitably be coated from solution directly onto the polymeric film and dried at about 120° C. for 3-5 minutes. Suitable thicknesses for the self-adhesive layer range from 0.005 mm to 0.050 mm.

A protective layer of release material is applied to the adhesive layer, and the release material onto which the polymeric material was cast can be removed. During continuous coating in production facilities, the polymeric film may be cast onto a substrate which has two release surfaces (e.g. P.E.T.P. film siliconised on both faces) and during wind-up of the tape onto a reel the release material will transfer to the adhesive face, thus acting as the protective layer.

Shaped pieces of the tape may suitably be prepared by die-cutting, the cut extending through the film, adhesive and release material, or by scoring the film and adhesive and then peeling the shaped pieces away from the release material when required.

The tape may suitably be supplied for use in a dispenser which separates the release material or interliner from the film and adhesive as the material is dispensed.

The preferred solvents for washing an article such as a printed circuit board after wave soldering and for dissolving the tape of the present invention are the solvents based on trichlorotrifluoroethane which are commercially available under the Trade Mark FREON from E. I. du Pont De Nemours, Inc, Wilmington, Del., U.S.A., or under the Trade Mark ARKLONE from Imperial Chemical Industries PLC, Runcorn, Cheshire, England. Such solvents include mixtures of trichlorotrifluoroethane with up to 50% of other solvents such as isopropanol, ethanol, methanol, methylene chloride, acetone and/or stabilisers and surfactants.

The article having the masking material applied thereto is suitably washed in a bath containing the fluorocarbon solvent, preferably under ultrasonic agitation for 2-4 minutes at a temperature of 33°-38° C. After washing, the article is rinsed in vapour from the washing solution for a period of 30 seconds to 5 minutes. Alternatively, the washing process may be effected by a jet spray of the fluorocarbon solvent. The washing process should result in total dissolution of the masking material by the washing solution, leaving no residue of tape (either polymeric film or adhesive) remaining on the article.

The high temperature resistance and flexibility of the plasticised solvent-soluble tape of the invention makes it advantageous also for use in hot air levelling. During the manufacture of printed circuit boards, after various etching and plating stages the tin-lead layer must be refinished. This is achieved by means of reflow, in which the tin-lead layer is re-melted, or by means of hot air levelling. Hot air levelling (H.A.L.) involves dip soldering of printed circuit boards and subsequent levelling of the tin-lead layer by means of hot air jets. Temperatures involved can reach 270° C. in the air stream and 250° C. in the tin-lead dip. Prior to soldering the board is dipped in flux for up to 8 seconds. Soldering itself takes up to 4 seconds. Usually the board is passed through an aqueous pre-etch before hot air levelling. This involves passing the board through a weak bath of sodium persulphate solution at 25°-30° C. for 30 seconds. Areas which must be masked during this process include fingers which are to be gold plated. The tape of the present invention is used for this masking. It is easy to apply, conforms to the board and can withstand the extreme conditions involved in hot air levelling. After the soldering process, the boards are washed for 1-3 minutes in a methylene chloride spray bath at 30°-35° C. The tape of the present invention is completely removed in this wash. It is important to note that proper solvent agitation and a high solvent temperature are required to ensure efficient washing. Other masking materials presently in use have not been very successful. As a result of their lack of flexibility they tend to be either partially or wholly removed by the hot air stream. Furthermore the poor heat resistance of these materials results in incomplete masking. The masking material may be difficult to remove and there is an increased risk of adhesive transfer onto the printed circuit board.

DESCRIPTION OF THE PREFERRED EMBODIMENT

The invention is illustrated in the following Examples. The poly(butyl methacrylate) used in Example 1 was the resin available from Roehm GmbH under the Trade Mark PLEXIGUM P24 having a molecular weight of 100,000-200,000. The resin available under the Trade Mark PLEXIGUM P675 is another suitable material. Other suitable materials include resins under the Trade Mark ELVACITE from E. I. du Pont de Nemours & Co Inc, and the Trade Mark ACRYLOID from Rohm & Haas Company.

EXAMPLE 1

A. Polymeric film

A solution was made up of the following ingredients:

|  | Parts by weight |
| --- | --- |
| Poly(butyl methacrylate) (powder) | 35 |
| Poly(butyl acrylate) (25% solution w/w in mineral spirit) | 20 |
| Trichloroethylene | 45 |

When this solution was coated onto siliconised P.E.T.P. release film and dried at 100° C. for 3 minutes to a thickness of 0.03 mm, a clear colourless film was obtained. Samples of this film were removed from the P.E.T.P. release film and were found to be a self-supporting film which could be wound to form a roll. The film had a plasticiser content of 12.5% based on the weight of the film (14.3% based on the weight of the polymethacrylate).

B. Adhesive

A solution was made up as follows:

|  | Parts by weight |
| --- | --- |
| Poly(butyl acrylate) (25% solution w/w in mineral spirit) | 92 |
| Alkyl Phenolic tackifying resin (PA 103 from Hoechst AG) | 8 |

When this solution was coated onto the polymeric film A and dried at 120° C. for 3 minutes to a thickness of 0.010 mm, a clear, tacky surface was created.

A protective layer consisting of siliconised P.E.T.P. film was applied to the adhesive layer and the P.E.T.P. on which the polymeric film A had been cast was removed.

Test procedure

Strips of the tape as produced above, having a width of 19 mm, were applied to a blank printed circuit board (unsoldered). The board was passed through a wave soldering process involving 3 seconds direct contact with molten solder at a temperature of 250° C. This process was repeated on the same board immediately afterwards with the same strips of tape still on the board.

No solder penetrated onto the board surface within the tape area during soldering. No tape shrinkage occurred. The tape was still intact and had not lifted from the board.

The printed circuit board was immersed in an ultrasonic cleaning bath consisting of a solution of

| | |
|---|---|
| Trichlorotrifluoroethane | 94.3% |
| Anhydrous methanol | 5.7% |
| The solution temperature was 33° C. | |

After a period of 3 minutes the board was removed from the bath and rinsed in the vapour from a similar solution which was at boiling temperature, i.e. 39° C. Period of rinsing: 1 minute. The board was removed and examined.

Results

No adhesive or film residue remained on the board. Complete dissolution of the tape had taken place and no tape residues were found in the bath solution.

EXAMPLE 2

A polymeric film formulation was made up as follows:

| | Parts by weight |
|---|---|
| Polyvinylpyrrolidone (G.A.F. Corporation, New York) | 40 |
| Polyethylene glycol 300 | 4 |
| Methanol | 56 |

This formulation was cast onto P.E.T.P. film siliconised and dried at 100° C. for 3 minutes to a thickness of 0.03 mm. A clear self-supporting film was obtained.

The film was coated with the self-adhesive layer as described in Example 1 and applied in tape form to a printed circuit board. The tape was successfully tested for heat resistance in an oven at 250° C. for 2 minutes. It was tested for solubility in a bath consisting of a solution of 94.3% trichlorotrifluoroethane and 5.7% anhydrous methanol. The tape dissolved completely in less than 2 minutes. These tests established the suitability of the tape for use as the masking material of the invention.

EXAMPLE 3

Example 2 was repeated with a formulation consisting of ethyl cellulose (available from Dow Chemical Company under the trade mark ETHOCEL) as a 15% w/w solution in trichloroethylene. A clear self-supporting film was again obtained. The film was coated with the self-adhesive layer as described in Example 1 and applied in tape form to a printed circuit board. This tape performed satisfactorily in the tests described in Example 2 and was therefore shown to be suitable for use as the masking material of the invention.

EXAMPLE 4

Example 1 was repeated using a fine grained acrylic resin available from Roehm GmbH under the Trade Mark PLEXIGUM P675 which is a poly(butyl methacrylate) resin having a molecular weight in the range 100,000–200,000. The following proportions were used in the polymeric film formulation:

| | Parts by Weight |
|---|---|
| PLEXIGUM P675 (powder) | 30 |
| Poly(butyl acrylate) (25% solution w/w in mineral spirit) | 25 |
| Dyestuff | 0.15 |
| Trichloroethylene | 44.85 |

The resulting film had a plasticiser content of 17.2% by weight, based on the weight of the film (20.8% based on the weight of the polymethacrylate). A tape was made as in Example 1 and it performed the tests described in Example 2 satisfactorily.

EXAMPLE 5

Masking of Printed Circuit Board during hot air levelling.
A. Polymeric Film:
A solution was made up as in Example 4.
When this solution was coated onto siliconised P.E.T.P. release film and dried at 100° C. for 3 minutes to a thickness of 0.05 mm, a clear colourless film was obtained. Samples of this film were removed from the P.E.T.P. release film and were found to be a self-supporting film which could be wound to form a roll.
B. Adhesive
A solution was made up as in Example 1.B

| | Parts by weight |
|---|---|
| Poly(butyl acrylate) (25% solution w/w in mineral spirit) | 92 |
| Alkyl phenolic tackifying resin (PA 103 from Hoechst AG) | 8 |

When this solution was coated onto the polymeric film A and dried at 130° C. for 3 minutes to a thickness of 0.030 mm, a clear tacky surface was created.

When wound into a roll, the siliconised P.E.T.P. film served as a protective interliner for the polymeric film (A) and the adhesive (B).

Test procedure

Strips of tape, as produced above, having a width of 19 mm and a length of 100 mm, were applied to a blank Printed Circuit Board (unsoldered), covering the fingers or edge connectors which were to be gold plated at a later stage and so must be masked from the hot air levelling process. The board was vertically immersed in solder flux for 6 seconds. It was removed and immediately immersed in tin-lead solder for 4 seconds. The solder temperature was 250° C. As the board was lifted from the solder bath, it passed over a hot air stream at a temperature of 270° C.

No solder penetrated onto the board surface within the tape area during soldering. No tape shrinkage occurred. The tape was still intact and had not lifted from the board.

The Printed Circuit Board was then passed through a washing system consisting of a spray wash with Methylene Chloride as the solvent. Solvent temperature was 30° C. and the period of washing was 1 minute.

RESULTS

No adhesive or film residue remained on the board. Complete dissolution of the tape had taken place and no solid tape residues were found in the bath solution.
We claim:

1. A pressure-sensitive adhesive masking tape for use during a high-temperature operation at temperatures up to 250° C., said tape comprising a self-supporting polymeric film other than poly(methyl methacrylate) coated with a layer of pressure-sensitive adhesive, both film and adhesive being resistant to temperatures up to 250° C. for up to 5 seconds and being soluble in a fluorocarbon solvent after such a high-temperature operation.

2. A tape according to claim 1, wherein both film and adhesive are resistant to temperatures up to 260° C. for up to 25 seconds.

3. A tape according to claim 1, wherein said polymeric film comprises a material selected from the group consisting of ethyl cellulose, polyvinylpyrrolidone and a polymethacrylate other than poly(methyl methacrylate).

4. A tape according to claim 3, wherein said polymethacrylate is selected from the group consisting of homopolymers of an alkyl ester of methacrylic acid wherein the alkyl group contains 3–6 carbon atoms; mixtures of two or more such homopolymers; mixtures of one or more such homopolymers with one or more homopolymers of an alkyl ester of methacrylic acid having less than 3 or more than 6 carbon atoms in the alkyl group; copolymers of two or more alkyl esters of methacrylic acid wherein the alkyl group contains 3–6 carbon atoms; mixtures of two or more such copolymers; and copolymers of one or more alkyl esters of methacrylic acid wherein the alkyl group contains 3–6 carbon atoms with one or more co-monomers which may be an alkyl ester of methacrylic acid having less than 3 or more than 6 carbon atoms or another compatible co-monomer.

5. A tape according to claim 1, wherein said polymeric film comprises a polymethacrylate selected from the group consisting of polymers of butyl esters of methacrylic acid, and copolymers thereof with each other or with methyl methacrylate or with a compatible co-monomer.

6. A tape according to claim 1, wherein the polymeric film comprises a poly(butyl methacrylate) resin.

7. A tape according to claim 1, wherein said polymeric film comprises a material selected from the group consisting of ethyl cellulose and polyvinylpyrrolidone.

8. A tape according to claim 1, wherein the pressure-sensitive adhesive comprises a polyacrylate.

9. A tape according to claim 1, wherein said polymeric film comprises a polymer and a plasticizer in an amount up to 90% by weight of said polymer.

10. A tape according to claim 9 wherein said plasticizer is a soft acrylic polymer.

11. A tape according to claim 1, which further comprises a protective layer of release material applied to said adhesive layer.

12. A tape according to claim 1 wherein said polymeric film comprises a poly(butyl methacrylate) resin plasticized with poly(butyl acrylate) in an amount up to 90% by weight of the poly(butyl methacrylate).

13. Masking material for masking a selected area of an electronic component during a high temperature operation, said masking material comprising a self-supporting film of a plasticized polymethacrylate other than poly(methyl methacrylate) coated with a layer of pressure-sensitive adhesive, both film and adhesive being resistant to temperatures up to 250° C. for up to 5 seconds and being soluble in a fluorocarbon solvent, said masking material being in a form of a continuous roll or of shaped pieces.

14. Masking material according to claim 13, wherein said shaped pieces are carried on a backing of release material.

15. A self-supporting film of a plasticised polymethacrylate selected from the group consisting of polymers of butyl esters of methacrylic acid, and copolymers thereof with each other or with methyl methacrylate or with a compatible co-monomer.

16. A self-supporting film according to claim 15, wherein the polymethacrylate comprises a poly(butyl methacrylate) resin.

17. A self-supporting film according to claim 16 wherein the film comprises a poly(butyl methacrylate) resin plasticized with poly(butyl acrylate) in an amount up to 90% by weight of the poly(butyl methacrylate).

18. A self-supporting film according to claim 15, wherein the film is plasticized with a soft acrylic polymer.

19. In a process of manufacture of an electronic component which includes the steps of applying a pressure-sensitive adhesive masking tape to a selected area of the component, carrying out a high-temperature operation on the component, and washing the component in a solvent which dissolves the masking tape, the improvement which comprises use of a masking tape comprising a self-supporting polymeric film other than poly(methyl methacrylate) coated with a layer of pressure-sensitive adhesive, both film and adhesive being resistant to temperatures up to 250° C. for up to 5 seconds and being soluble in a fluorocarbon solvent after such a high-temperature operation, and use of a fluorocarbon solvent to render the component clean as well as to dissolve the masking tape.

20. A process according to claim 19 which comprises use of a tape wherein the polymeric film comprises a plasticized poly(butyl methacrylate) resin.

* * * * *

UNITED STATES PATENT AND TRADEMARK OFFICE
CERTIFICATE OF CORRECTION

PATENT NO. : 4,917,926

DATED : April 17, 1990

INVENTOR(S) : Weinhold et al

It is certified that error appears in the above-identified patent and that said Letters Patent is hereby corrected as shown below:

Front page of the patent, left hand column item [30]: insert

--October 2, 1987 [JP] Japan---62249672 -- after "Nov. 9, 1987 [IE] Ireland...3002/87"

Signed and Sealed this

Sixteenth Day of July, 1991

Attest:

HARRY F. MANBECK, JR.

*Attesting Officer*  *Commissioner of Patents and Trademarks*